United States Patent
Zhang

(10) Patent No.: US 7,317,048 B2
(45) Date of Patent: Jan. 8, 2008

(54) VARIABLE RESISTANCE POLY(3,4-ETHYLENEDIOXYTHIOPHENE)/POLY(STYRENE SULFONATE) FOR USE IN ELECTRONIC DEVICES

(75) Inventor: Chi Zhang, Goleta, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 266 days.

(21) Appl. No.: 10/748,965

(22) Filed: Dec. 30, 2003

(65) Prior Publication Data

US 2004/0192830 A1    Sep. 30, 2004

Related U.S. Application Data

(60) Provisional application No. 60/438,170, filed on Jan. 6, 2003.

(51) Int. Cl.
*C08K 5/17* (2006.01)
*C08K 5/3432* (2006.01)
*C08G 75/06* (2006.01)

(52) U.S. Cl. ............ 524/251; 524/253; 524/236; 524/99; 528/403; 528/377; 252/500; 252/301.16

(58) Field of Classification Search ......... 524/548, 524/379, 366, 376, 210, 215, 237, 251, 253, 524/284, 173, 167, 99, 204, 252; 528/403, 528/377, 408; 526/256

See application file for complete search history.

(56) References Cited

U.S. PATENT DOCUMENTS

| | | | |
|---|---|---|---|
| 4,552,927 A | 11/1985 | Warren | |
| 5,766,515 A | 6/1998 | Jonas et al. | |
| 6,001,281 A * | 12/1999 | Lessner et al. | 252/500 |
| 6,056,899 A | 5/2000 | Lessner et al. | |
| 6,083,635 A | 7/2000 | Jonas et al. | |
| 6,136,176 A | 10/2000 | Wheeler et al. | |
| 6,136,372 A | 10/2000 | Lessner et al. | |
| 6,201,051 B1 * | 3/2001 | Mager et al. | 524/261 |
| 6,586,041 B1 * | 7/2003 | Ibar | 427/58 |
| 2002/0173579 A1 * | 11/2002 | Jonas et al. | 524/502 |
| 2003/0088032 A1 * | 5/2003 | Luebben et al. | 525/410 |
| 2005/0012068 A1 * | 1/2005 | Kirchmeyer et al. | 252/62 |

FOREIGN PATENT DOCUMENTS

| | | |
|---|---|---|
| EP | 0 866 110 A1 | 9/1998 |
| EP | 1 003 179 A1 * | 5/2000 |
| EP | 0 757 088 B1 | 6/2000 |
| EP | 1 010 733 A2 | 6/2000 |
| EP | 1 081 548 A1 * | 3/2001 |
| EP | 0 786 926 B1 | 8/2001 |
| EP | 0 765 106 B1 | 11/2002 |
| WO | WO 98/01909 A1 | 1/1998 |
| WO | WO 98/25274 A1 * | 6/1998 |
| WO | WO 01/13087 A2 | 2/2001 |
| WO | WO 01/29611 A1 | 4/2001 |
| WO | WO 01/46987 A2 | 6/2001 |
| WO | WO 01/47043 A1 | 6/2001 |
| WO | WO 01/47044 A2 | 6/2001 |
| WO | WO 01/47045 A1 | 6/2001 |
| WO | WO 02/072660 A1 | 9/2002 |
| WO | WO 2004/021366 A2 | 3/2004 |

OTHER PUBLICATIONS

Kim et al., Synthetic Metals, 2002, 311-316.*
Lefebvre et al., Chem. Mater., 1999, 11, 262-268.*
"Baytron CPUD2" product data sheet.*
Kim, J.Y. et al., Enhancement of electrical conductivity of poly(3,4-ethylenedioxythiophene)/poly(4-styrenesulfonate) by a change of solvents, Synthetic Metals, 2002, 311-316, 126, Elsevier Science B.V.
Zhang, Fengling et al., Polymer Photovoltaic Cells with Conducting Polymer Anodes, Advanced Materials, 2002, 662-665, 14(9), Wiley-VCH Verlag GmbH.
A. J. Sharpe, Jr. et al., Improved Cationic Conductive Polymer, Calgon Corp., Pittsburgh, PA. Coating Conference [Proceedings], pp. 83-87, 1981, ISSN 0384-2771.

* cited by examiner

*Primary Examiner*—David W. Wu
*Assistant Examiner*—Rip A. Lee
(74) *Attorney, Agent, or Firm*—John H. Lamming

(57) ABSTRACT

Variable resistance PEDT/PSS buffer layers are provided for use in electroluminescent devices such as, e.g., OLEDs. In accordance with another embodiment, there are provided OLEDs comprising variable resistance PEDT/PSS buffer layers. In accordance with a further embodiment, methods have been developed for varying the conductivity of a PEDT/PSS layer cast from aqueous solution onto a substrate, by adding a co-solvent to the aqueous solution of PEDT/PSS prior to casting.

4 Claims, 3 Drawing Sheets

VARIABLE RESISTANCE POLY(3,4-ETHYLENEDIOXYTHIOPHENE)/ POLY(STYRENE SULFONATE) FOR USE IN ELECTRONIC DEVICES

FIELD OF THE INVENTION

The invention relates to the use of conductive polymers in the production of electronic devices, for example, pixellated electroluminescent devices, such as, organic light emitting diodes.

BACKGROUND OF THE INVENTION

Conductive polymers originally attracted the attention of researchers over 20 years ago. The interest generated by these polymers compared to conventional conducting materials (e.g., metals) was largely due to factors such as light weight, flexibility, durability, and potential ease of processing. To date the most commercially successful conductive polymers are the polyanilines and polythiophenes, which are marketed under a variety of tradenames.

The recent development of electroluminescent (EL) devices for use in light emissive displays has resulted in a rekindled interest in conductive polymers. EL devices such as organic light emitting diodes (OLEDs) containing conductive polymers generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). In addition, conductive polymers can be used for the anode. The anode is optionally supported on a glass or plastic substrate. The EL polymer is typically a conjugated semiconducting polymer such as poly(paraphenylenevinylene) or polyfluorene. The cathode is typically any material, such as Ca or Ba, that has the ability to inject electrons into the otherwise empty π-band of the semiconducting, EL polymer.

The buffer layer is typically a conductive polymer and facilitates the injection of holes from the anode into the EL polymer layer. The buffer layer can also be called a hole-injection layer, a hole transport layer, or may be characterized as part of a bilayer anode. Typical conductive polymers employed as buffer layers are the emeraldine salt form of polyaniline (PANI) or a polymeric dioxythiophene doped with a sulfonic acid. The most widely used dioxythiophene is poly(3,4-ethylenedioxythiophene) doped with polystyrene sulfonic acid, abbreviated as PEDT/PSS. PEDT/PSS is available commercially from Bayer, as Baytron® P.

PEDT/PSS has emerged as a leading candidate for use as a buffer layer in EL devices such as red, green, blue organic light emitting diodes (RGB OLEDs). However, one factor which is inhibiting the widespread use of PEDT/PSS in RGB OLEDs is the inability to control conductivity of this material without sacrificing device performance. For example, in active matrix OLEDs, a buffer layer having higher conductivity can be useful. In passive matrix devices, a layer of PEDT/PSS having a conductivity no greater than the inherent conductivity of about $1.2 \times 10^{-5}$ Siemens per centimeter (S/cm) is desired in order to minimize crosstalk between pixels in the display. It may be possible to decrease the conductivity by using very thin layers. However, reducing the thickness of PEDT/PSS buffer layers in OLEDs is not a good option, since thinner films give lower manufacturing yield due to the formation of electrical shorts. To avoid shorts, it is necessary to use a relatively thick buffer layer with a thickness of about 200 nm. It would be desirable to be able to form thicker layers of PEDT/PSS without increasing the conductivity.

SUMMARY OF THE INVENTION

In accordance with one embodiment of the invention, there are provided PEDT/PSS films with conductivities that can be varied and improved thickness control. In accordance with another embodiment of the invention, there are provided PEDT/PSS buffer layers for use in electroluminescent devices such as, e.g., OLEDs. In accordance with yet another embodiment of the invention, there are provided electroluminescent devices comprising PEDT/PSS buffer layers.

In accordance with a further embodiment of the invention, there are provided methods for producing buffer layers for use in OLEDs, the buffer layers having conductivities that can be varied and improved thickness control. The method comprises adding an effective amount of at least one co-solvent to an aqueous solution of PEDT/PSS, and casting the solution onto a substrate.

In accordance with a still further embodiment of the invention, methods have been developed for varying the conductivity of a PEDT/PSS layer cast from aqueous solution onto a substrate, the methods comprising adding at least one co-solvent to the aqueous solution of PEDT/PSS prior to casting.

In accordance with a further embodiment of the invention, methods have been developed for increasing the thickness of a PEDT/PSS layer cast from aqueous solutions onto a substrate, the methods comprising adding at least one co-solvent to the aqueous solution of PEDT/PSS prior to casting.

DETAILED DESCRIPTION OF THE INVENTION

Figure 1:
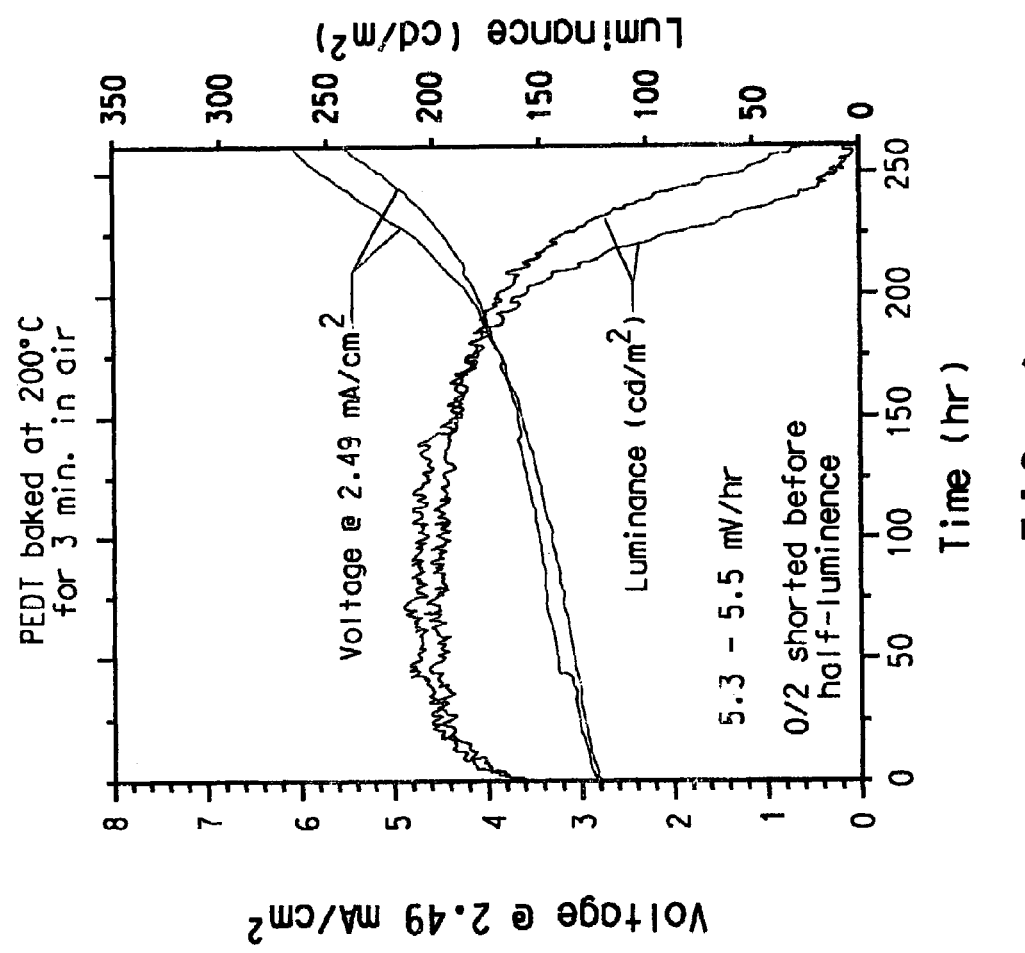
FIG. 1 illustrates the stress life at 80° C. of a device employing a buffer layer of PEDT/PSS (Baytron P CH8000, lot #CHN0004) cast from an aqueous solution containing no co-solvent. Th

In accordance with one embodiment of the invention, there are provided variable resistance PEDT/PSS films and buffer layers having greater thickness. These are useful in electronic devices, and particularly in electroluminescent devices such as, e.g., OLEDs. In accordance with another embodiment of the invention, there are provided OLEDs comprising the above-described PEDT/PSS buffer layers.

Electrical resistivity is inversely proportional to electrical conductivity. Thus, as employed herein, the phrases "high resistance" and "low conductivity" are used interchangeably with reference to the PEDT/PSS buffer layers described herein. Similarly, "low resistance" and "high conductivity"

are used interchangeably. As used herein, the phrases "high resistance" and "low conductivity" each refer to a conductivity level less than that of commercially available PEDT/PSS, i.e., less than about $1.2 \times 10^{-5}$ S/cm.

Resistivity and conductivity values are typically reported in units of ohm-centimeter (ohm-cm) and Siemens per centimeter (S/cm), respectively. As used herein, conductivity values are reported (using the unit S/cm) rather than resistivity values.

In accordance with a further embodiment of the invention, there are provided methods for varying the conductivity of a PEDT/PSS layer cast from aqueous solution onto a substrate, the method comprising adding an effective amount of at least one co-solvent to the aqueous solution. Depending on the choice of co-solvent and amount of co-solvent, the conductivity of the PEDT/PSS layer can be effectively controlled, i.e., the conductivity may be increased or decreased depending on the desired application.

As used herein, the term "co-solvent" refers to a substance which is liquid at room temperature and is miscible with water. As used herein, the term "miscible" means that the co-solvent is capable of being mixed with water (at concentrations set forth herein for each particular co-solvent) to form a substantially homogeneous solution.

In one embodiment of the invention, the co-solvent is an organic solvent. Organic solvents contemplated for use in the practice of the invention include ether solvents, alcohol solvents, alcohol ether solvents, ketone solvents, nitrile solvents, sulfoxide solvents, amide solvents, amine solvents, carboxylic acid solvents, and the like, as well as combinations of any two or more thereof.

Exemplary ether solvents contemplated for use in the practice of the invention include diethyl ether, ethyl propyl ether, dipropyl ether, disopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, and the like, as well as combinations of any two or more thereof.

Exemplary alcohol solvents contemplated for use in the practice of the invention include methanol, ethanol, 1-propanol, 2-propanol (i.e., isopropanol), 1-butanol, 2-butanol, 2-methyl-i-propanol (i.e., isobutanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, and the like, as well as combinations of any two or more thereof. In one embodiment of the invention, the alcohol solvent is methanol, ethanol, or isopropanol. In a further embodiment of the invention, the alcohol solvent is isopropanol.

Exemplary alcohol ether solvents contemplated for use in the practice of the invention include 2-butoxyethanol, 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, and the like, as well as combinations of any two or more thereof. In one embodiment of the invention, the alcohol ether solvent is 1-methoxy-2-propanol, 2-methoxyethanol, or 2-butoxyethanol. In another embodiment of the invention, the alcohol ether solvent is 2-butoxyethanol.

Exemplary ketone solvents contemplated for use in the practice of the invention include acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, and the like, as well as combinations of any two or more thereof.

Exemplary nitrile solvents contemplated for use in the practice of the invention include acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, n-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, and the like, as well as combinations of any two or more thereof.

Exemplary sulfoxide solvents contemplated for use in the practice of the invention include dimethyl sulfoxide (DMSO), di-n-butyl sulfoxide, tetramethylene sulfoxide, methyl phenyl sulfoxide, and the like, as well as combinations of any two or more thereof. In one embodiment of the invention, the sulfoxide solvent is DMSO or di-n-butyl sulfoxide. In another embodiment of the invention, the sulfoxide solvent is DMSO.

Exemplary amide solvents contemplated for use in the practice of the invention include dimethyl formamide (DMF), dimethyl acetamide, acylamide, 2-acetamidoethanol, N,N-dimethyl-m-toluamide, trifluoroacetamide, N,N-dimethylacetamide, N,N-diethyldodecanamide, □-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diidopropylformamide, 1-formylpiperidine, N-methylformanilide, and the like, as well as combinations of any two or more thereof. In one embodiment of the invention, the amide solvent is DMF, dimethyl acetamide, or acylamide. In another embodiment of the invention, the amide solvent is DMF.

Exemplary amine solvents contemplated for use in the practice of the invention include mono-, di-, and tri-alkyl amines (as used herein, the term "alkyl" refers to a straight or branched chain $C_1$-$C_6$ hydrocarbyl moiety), cyclic amines (such as, e.g., pyrrolidine), aromatic amines (such as, e.g., pyridine) and the like, as well as combinations of any two or more thereof. In one embodiment of the invention, the amine solvent is pyridine.

Exemplary carboxylic acid solvents contemplated for use in the practice of the invention include $C_1$ up to about $C_6$ straight or branched chain carboxylic acids. In one embodiment of the invention, the carboxylic acid solvent is formic acid.

The amount of co-solvent added to an aqueous solution of PEDT/PSS depends on the desired conductivity of the PEDT/PSS layer cast therefrom. The co-solvent is typically present in the aqueous solution at a concentration in the range of about 0.5 wt % up to about 70 wt % (wherein wt % refers to percent by weight of the total solution). In one embodiment, the co-solvent is present in the aqueous solution at a concentration in the range of about 0.5 wt % up to about 35 wt %. In another embodiment of the invention, the co-solvent is present in the aqueous solution at a concentration in the range of about 0.5 wt % up to about 10 wt %. In still another embodiment of the invention, the co-solvent is present in the aqueous solution at a concentration in the range of about 0.5 wt % up to about 2.5 wt %.

By judicious choice of co-solvent and amount of co-solvent added to an aqueous solution of PEDT/PSS, the conductivity of a PEDT/PSS layer cast from the solution onto a substrate can be varied by several orders of magnitude. Accordingly, invention methods are useful in applications where either an increase or a decrease in the conductivity of a PEDT/PSS layer is desired.

In another exemplary embodiment of the invention, addition of an alcohol ether solvent such as, e.g., 2-butoxyethanol, to an aqueous solution of PEDT/PSS increases conductivity of the PEDT/PSS layer cast therefrom. For example, a PEDT/PSS layer cast from an aqueous solution containing 20 wt % 2-butoxyethanol exhibits a 100-fold increase in conductivity compared to a layer cast from an aqueous solution containing no co-solvent (i.e., $10^{-5}$ S/cm for PEDT/PSS with no added co-solvent vs. $10^{-3}$ S/cm for PEDT/PSS with added 2-butoxyethanol). PEDT/PSS layers with higher conductivity can be used in devices such as active matrix LED displays and photovoltaic cells.

PEDT/PSS layers prepared according to the invention may be cast onto a substrate using a variety of techniques well-known to those skilled in the art. Typical casting techniques include, for example, solution casting, drop casting, curtain casting, spin-coating, screen printing, and the like. Casting is typically carried out at room temperature, although casting may also be carried out at higher or lower temperatures as known in the art.

PEDT/PSS layers prepared according to the invention may be cast onto a variety of substrates. In one embodiment of the invention, the PEDT/PSS layer is cast onto a thin layer of anode material that is optionally cast onto a substrate such as glass, plastic, ceramic, silicon, and the like. Anode materials contemplated for use in the practice of the invention include indium/tin oxide (ITO), mixed oxides of the Group 2 elements (i.e., Be, Mg, Ca, Sr, Ba, Ra), the Group 13 elements (i.e., B, Al, Ga, In, Tl), the Group 14 elements (C, Si, Ge, Sn, Pb), and the like. As used herein, the phrase "mixed oxide" refers to oxides having two or more different cations selected from the Group 2 elements. Alternatively, the anode may be an organic material, such as conductive polyaniline or poly(dioxythiophenes).

In a further embodiment of the invention, it has been discovered that drying conditions of PEDT/PSS layers cast onto a substrate may be greatly simplified. For example, PEDT/PSS layers prepared according to the invention can be dried at temperatures below 90° C. These milder drying temperatures (relative to typical drying temperatures of above 200° C.) are desirable for flexible LED applications. The higher temperatures can cause some degradation of the flexible substrate and/or the electroluminescent material.

In a still further embodiment of the invention, there are provided methods for increasing the thickness of a PEDT/PSS layer cast from aqueous solution onto a substrate, the method comprising adding an effective amount of at least one co-solvent to the aqueous solution.

The invention will now be described in greater detail by reference to the following non-limiting examples.

EXAMPLES

Example 1

Effect of the Co-solvent on Conductivity and Thickness of PEDT/PSS

The aqueous solutions of PEDT/PSS used in the following examples were purchased from Bayer under the tradename Baytron P CH8000 (Baytron P CH8000 typically contains approximately 0.14 wt % PEDT and approximately 2.6 wt % PSS). Glass substrates were prepared with patterned ITO electrodes. PEDT/PSS layers were spin-cast as films on top of the patterned substrates and thereafter, dried by heating on a hot plate at 200° C. for 3 minutes in air. The resistance between ITO electrodes was measured using a high resistance electrometer. Thickness of the film was measured by using a Dec-Tac surface profiler (Alpha-Step 500 Surface Profiler, Tencor Instruments). As shown in Table 1 below, the conductivity of PEDT/PSS layers can be varied by over 3 orders of magnitude. Also shown in Table 1, is that the addition of isopropanol increases the thickness of the layer without increasing the conductivity.

TABLE 1

Conductivity of PEDT/PSS with co-solvent

| Co-Solvent [wt %] | Spin Rate [rpm] | Thickness [Å] | Conductivity [S/cm] |
| --- | --- | --- | --- |
| None | 1000 | 1245 | $1.2 \times 10^{-5}$ |
| +70% 2-butoxyethanol | 1000 | 540 | $1.0 \times 10^{-2}$ |
| +30% 2-butoxyethanol | 1000 | 1546 | $2.8 \times 10^{-2}$ |
| +10% Isopropanol | 1000 | 2110 | $1.0 \times 10^{-5}$ |
| +20% Isopropanol | 1000 | 2150 | $9.9 \times 10^{-6}$ |
| +30% Isopropanol | 1000 | 1587 | $1.8 \times 10^{-5}$ |
| +40% Isopropanol | 1000 | 1968 | $3.4 \times 10^{-5}$ |
| +50% Isopropanol | 1000 | 930 | $5.6 \times 10^{-5}$ |
| +10% 2-butoxyethanol | 1000 | 1550 | $1.0 \times 10^{-4}$ |
| +20% 2-butoxyethanol | 1000 | 1573 | $1.0 \times 10^{-3}$ |
| +30% 2-butoxyethanol | 1000 | 1404 | $5.0 \times 10^{-4}$ |
| +40% 2-butoxyethanol | 1000 | 1335 | $3.6 \times 10^{-4}$ |
| +50% 2-butoxyethanol | 1000 | 994 | $1.1 \times 10^{-4}$ |
| +10% 2-butoxyethanol | 1000 | 1304 | $7.6 \times 10^{-5}$ |
| +10% DMF | 1000 | 1022 | $5.8 \times 10^{-4}$ |
| +10% DMSO | 1000 | 3039 | $6.4 \times 10^{-2}$ |
| +10% Formic Acid | 1000 | 1086 | $2.1 \times 10^{-5}$ |
| +10% Isopropanol | 1000 | 1366 | $1.3 \times 10^{-5}$ |
| +10% Pyridine | 1000 | 1748 | $8.5 \times 10^{-5}$ |
| +2% Isopropanol | 1000 | 1634 | $1.3 \times 10^{-5}$ |
| +5% Isopropanol | 1000 | 2173 | $8.8 \times 10^{-6}$ |
| +2% DMSO | 1000 | 1200 | $9.8 \times 10^{-6}$ |
| +5% DMSO | 1000 | 3039 | $1.0 \times 10^{-2}$ |

Example 2

Figure 2:
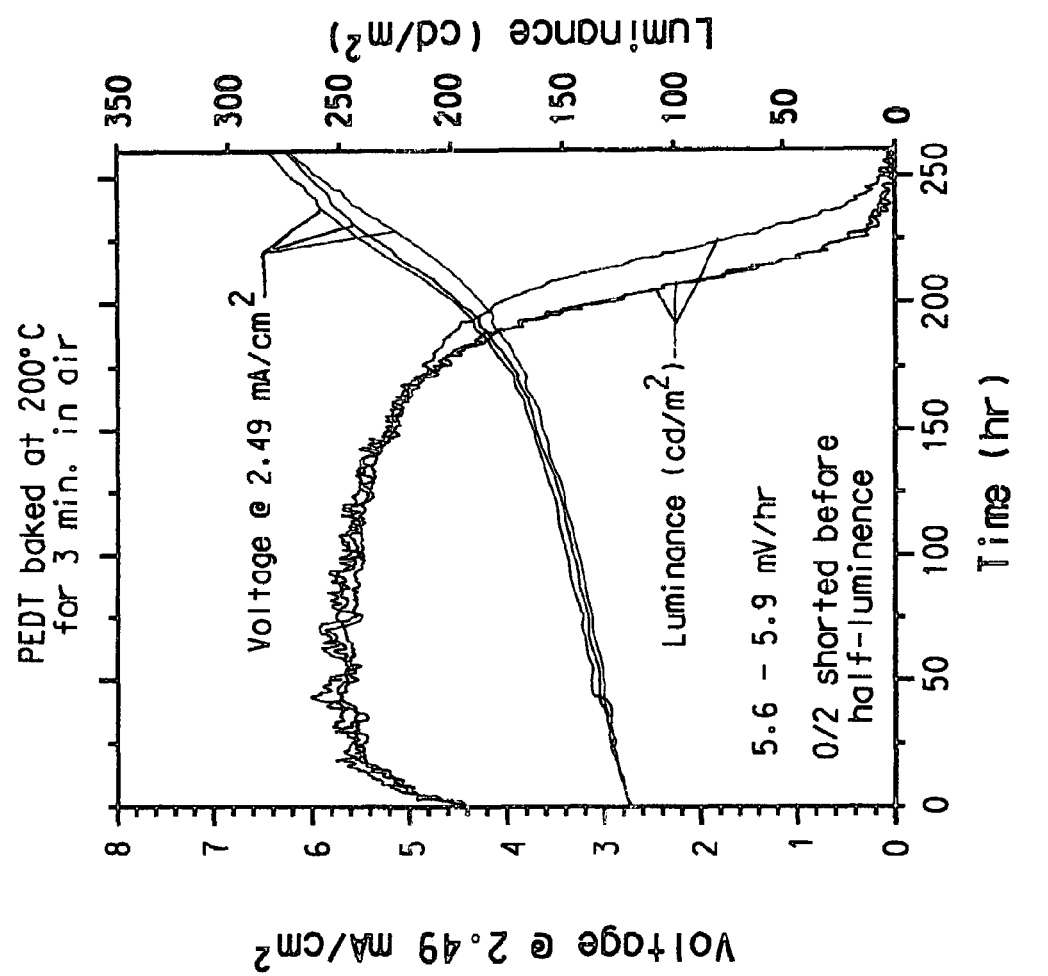
FIG. 2 illustrates the stress life at 80° C. of a device employing a layer of PEDT/PSS cast from an aqueous solution containing 10 wt % isopropanol, (i.e., Baytron P CH8000, lot #CHN0004 with 10 wt % isopropanol).
Figure 3:
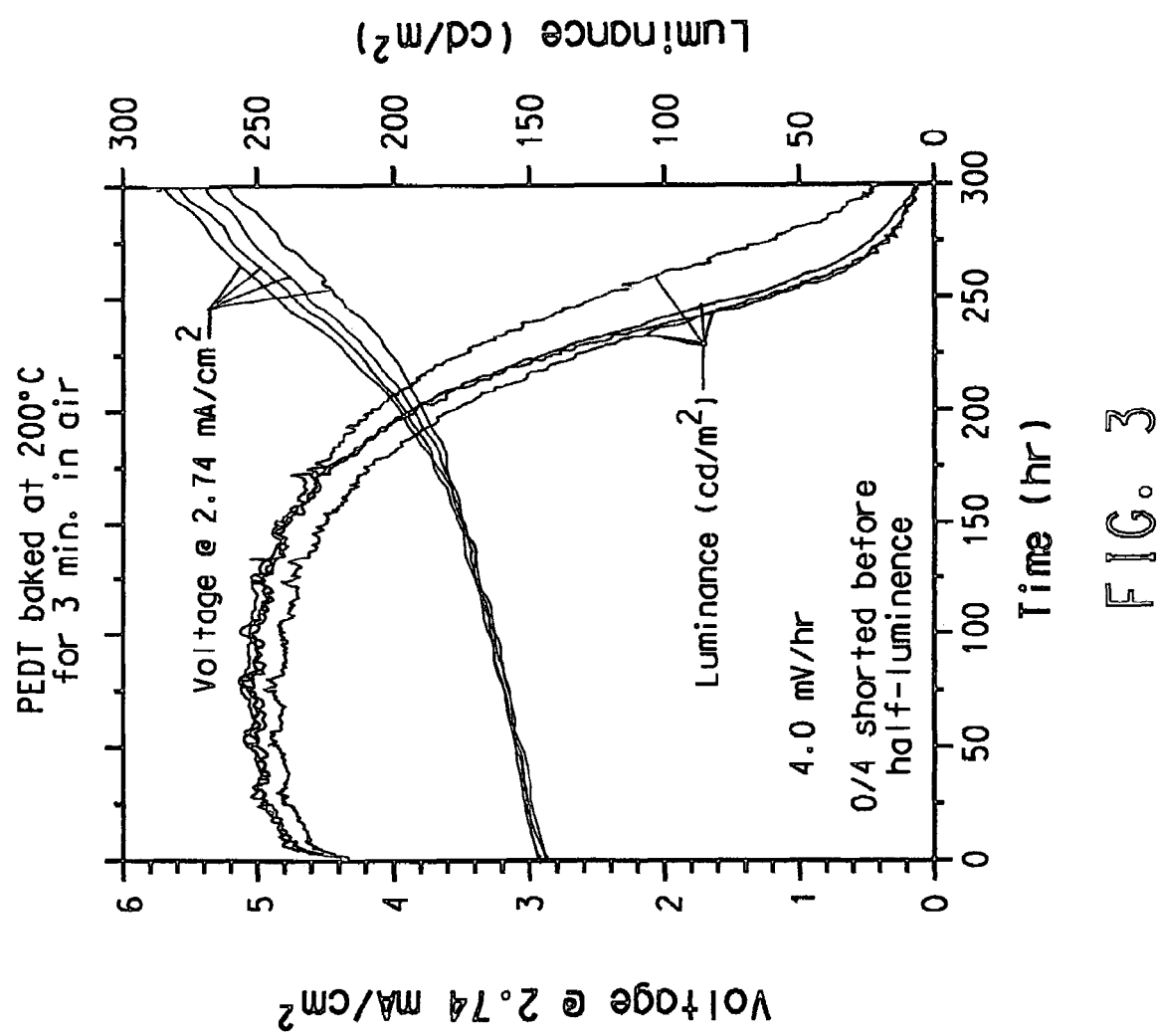
FIG. 3 illustrates the stress life at 80° C. of a device employing a layer of PEDT/PSS cast from an aqueous solution containing 30 wt % 2-butoxyethanol, (i.e., Baytron P CH8000, lot #CHN0004 with 30 wt % 2-butoxyethanol).

Effect on Stress Life of a Device Employing PEDT/PSS Layers Cast From an Aqueous Solution Containing Co-solvent FIGS. 1-3 compare the stress life of electroluminescent (EL) devices having PEDT/PSS layers cast from aqueous solutions containing various co-solvents. The EL devices were made using as an electroluminescent material a soluble poly(1,4-phenylenevinylene) copolymer (C-PPV), as described by H. Becker et al., Adv. Mater. 12, 42 (2000). The devices had the configuration:

glass substrate—ITO anode—PEDT/PSS buffer layer—C-PPV—Ba/Al cathode

FIG. 1 illustrates the stress life of a device employing PEDT/PSS without co-solvent. The buffer layer had a conductivity of $1.2 \times 10^{-5}$ S/cm. The buffer layer was cast at 1000 rpm and had a thickness of 129 nm. The electroluminescent layer was cast at 650 rpm and had a thickness of 74 nm. The stress life of the device was measured at 2.49 mA/cm$^2$ with 3 cm$^2$ backlight. The initial efficiency was 6.9-7.0 cd/A and the operating voltage was 3.7-3.8 V.

FIG. 2 illustrates the stress life of a device employing PEDT/PSS with 10% isopropanol. The buffer layer had a conductivity of $1.4 \times 10^{-5}$ S/cm. The buffer layer was cast at 1000 rpm and had a thickness of 181 nm. The electroluminescent layer was cast at 650 rpm and had a thickness of 74 nm. The stress life of the device was measured at 2.49 mA/cm$^2$ with 3 cm$^2$ backlight. The initial efficiency was 8.0-9.0 cd/A and the operating voltage was 3.4-3.5 V. The isopropanol co-solvent did not change the conductivity, but did increase the thickness of the PEDT/PSS layer.

FIG. 3 illustrates the stress life of a device employing PEDT/PSS with 30% 2-butoxyethanol. The buffer layer had a conductivity of $2.8 \times 10^{-2}$ S/cm. The buffer layer was cast at 1000 rpm and had a thickness of 155 nm. The electroluminescent layer was cast at 2800 rpm and had a thickness of 74 nm. The stress life of the device was measured at 2.74 mA/cm$^2$ with 3 cm$^2$ backlight. The initial efficiency was 7.1-7.2 cd/A and the operating voltage was 3.4-3.5 V. The 2-butoxyethanol co-solvent increased the conductivity of PEDT/PSS from $1.2 \times 10^{-5}$ S/cm to $2.8 \times 10^{-2}$ S/cm. The data in FIGS. 1-3 demonstrate that by adding at least one co-solvent to aqueous solutions of PEDT/PSS the conductivity and thickness of PEDT/PSS layers cast therefrom can be controlled without compromising the stress life of the devices.

While the invention has been described in detail with reference to certain preferred embodiments thereof, it will be understood that modifications and variations are within the spirit and scope of that which is described and claimed.

What is claimed is:

1. A method for varying conductivity of a poly(3,4-ethylenedioxythiophene)/poly(styrenesulfonate) layer cast from aqueous solution onto a substrate, said method comprising adding a conductivity varying amount of at least one organic co-solvent to said aqueous solution, wherein said organic co-solvent comprises an amine solvent.

2. A method according to claim 1, wherein said amine solvent comprises a solvent selected from a mono-, di-, or tri-alkyl amine, a cyclic amine, an aromatic amine, and combinations of any two or more thereof.

3. A method according to claim 1, wherein said amine solvent comprises an aromatic amine solvent.

4. A method according to claim 3, wherein said aromatic amine comprises pyridine.

* * * * *